United States Patent [19]

Yamamoto et al.

[11] Patent Number: 5,066,609
[45] Date of Patent: Nov. 19, 1991

[54] METHOD OF MANUFACTURING A SEMICONDUCTOR DEVICE INCLUDING A TRENCH CAPACITOR

[75] Inventors: Tadashi Yamamoto, Kawasaki; Yusuke Kohyama; Takeshi Tanaka, both of Yokohama, all of Japan

[73] Assignee: Kabushiki Kaisha Toshiba, Kawasaki, Japan

[21] Appl. No.: 469,055

[22] Filed: Jan. 23, 1990

[30] Foreign Application Priority Data

Jul. 25, 1988 [JP] Japan .................. 63-185083

[51] Int. Cl.$^5$ .......................... H01L 21/70
[52] U.S. Cl. ...................... 437/52; 437/47; 437/48; 437/60; 437/919; 437/203; 357/23.6
[58] Field of Search .......... 437/38, 47, 52, 60, 437/160, 162, 203, 228, 919; 357/23.6, 51

[56] References Cited

U.S. PATENT DOCUMENTS

| | | | |
|---|---|---|---|
| 4,396,460 | 8/1983 | Tamaki et al. | 437/67 |
| 4,472,212 | 9/1984 | Kimsbron | 437/162 |
| 4,509,249 | 5/1985 | Goto et al. | 437/67 |
| 4,520,552 | 6/1985 | Arnould et al. | 437/67 |
| 4,569,701 | 2/1986 | Oh | 437/162 |
| 4,676,847 | 6/1987 | Lin | 437/67 |
| 4,688,064 | 8/1987 | Ogura et al. | 357/23.6 |

FOREIGN PATENT DOCUMENTS

| | | | |
|---|---|---|---|
| 0157044 | 12/1981 | Japan . | |
| 0213053 | 10/1985 | Japan | 357/23.6 |
| 0234361 | 11/1985 | Japan | 437/67 |
| 0253263 | 12/1985 | Japan | 357/23 |
| 0142764 | 6/1986 | Japan | 437/67 |
| 0166157 | 7/1986 | Japan | 357/23 |
| 0194748 | 8/1986 | Japan | 437/67 |
| 0289642 | 12/1986 | Japan | 437/67 |
| 0289657 | 12/1986 | Japan | 357/23.6 |
| 0029161 | 2/1987 | Japan | 357/23.6 |
| 0120061 | 6/1987 | Japan | 437/67 |
| 0064316 | 3/1989 | Japan | 437/67 |
| 0206620 | 8/1989 | Japan | 437/67 |
| 0085988 | 8/1983 | United Kingdom . | |
| 2138207 | 10/1984 | United Kingdom . | |

OTHER PUBLICATIONS

T. Morie et al., "Depletion Trench Capacitor Cell", 2419 Japanese Journal of Applied Physics, (1983) suppl. 15th conf., Tokyo, Japan.
H. Ishiuchi et al., "Submicron CMOS Technologies for Four Mega Bit Dynamic Ram" IEDM '85 Technical Digest.
Tohru Furuyama et al., "An Experimental 4Mb CMOS DRAM", 1986 IEEE International Solid-State Circuits Conference.
Nicky C. C. Lu, "Advanced Cell Structures of Dynamic RAMS" IEEE Circuits and Device Magazine, Jan. 1989, pp. 27-36.
Jambolkar, "Improved Polysilicon-Filled Trench" IBM TD 13, vol. 27, No. 3, Aug. 84.

Primary Examiner—Brian E. Hearn
Assistant Examiner—Tom Thomas
Attorney, Agent, or Firm—Banner, Birch, McKie & Beckett

[57] ABSTRACT

A method of manufacturing a semiconductor device comprises the steps of selectively etching a semiconductor substrate to form a groove therein, forming a first layer of a conductivity type on the sides and the bottom of the groove, forming a second layer of an insulation type along the inner surface of the first layer and the semiconductor substrate, forming a third layer of a conductivity type along the inner surface of the second layer, patterning the third layer to form a capacitor electrode, forming a fourth layer of an insulation type which covers the capacitor electrode, forming a fifth layer on the fourth layer so as to fill up the groove, etching the fifth layer so as to remain only in the groove, and forming a sixth layer of an insulation type on the fifth layer.

9 Claims, 5 Drawing Sheets

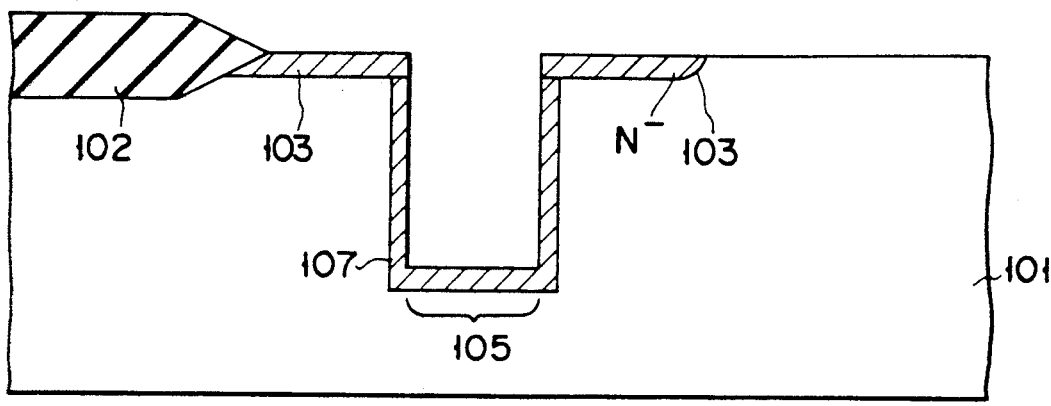
F I G. 3D
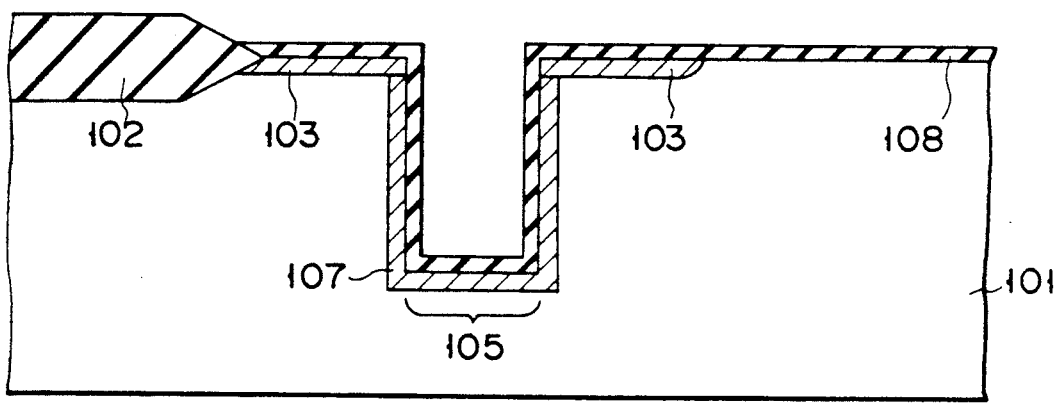
F I G. 3E
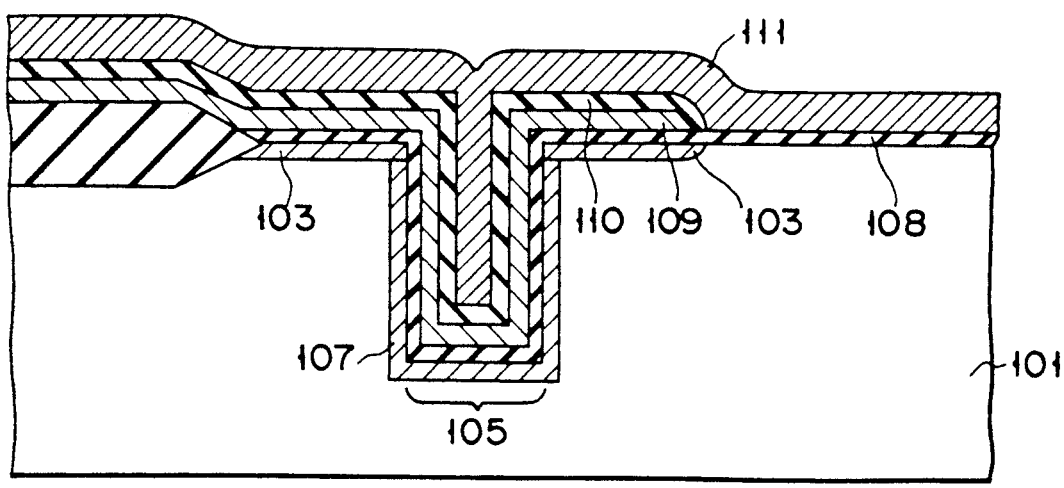
F I G. 3F

METHOD OF MANUFACTURING A SEMICONDUCTOR DEVICE INCLUDING A TRENCH CAPACITOR

BACKGROUND OF THE INVENTION

1. Field of the Invention

The present invention relates to a method of manufacturing a semiconductor device and, more particularly, to a method of manufacturing a semiconductor device including a trench capacitor.

2. Description of the Related Art

In the field of a semiconductor integrated circuit, a trench capacitor is well-known as a capacitor capable of achieving a large capacity in a small area. FIG. 1 is a cross-sectional view showing a conventional typical structure of the trench capacitor.

In FIG. 1, reference numeral 1 denotes a P-type semiconductor substrate, 2 indicates an N-type diffusion layer, 3 and 5 show insulating films, 4 and 6 indicate polysilicon layers, and 7 denotes an interlayer insulating film. Diffusion layer 2 and polysilicon layer 4 serve as both electrodes of the trench capacitor, and insulating film 3 serves as a dielectric film of the trench capacitor. Polysilicon layer 6 is embedded in a groove to flatten the surface of a semiconuctor body and is electrically insulated from polysilicon layer 4 by insulating film 5.

Referring to FIGS. 2A to 2C, an explanation will be given of a manufacturing process in the case where polysilicon layer 6 is embedded into the groove.

As illustrated in FIG. 2A, insulating film 5 is formed on polysilicon layer 4 and then polysilicon layer 6 is formed on the entire surface of insulating film 5 so as to fill up the groove. As shown in FIG. 2B, etching is performed, using insulating film 5 as a stopper of the etching, so as to make polysilicon layer 6 remain only in the groove. Next, insulating film 5 formed on the surface of polysilicon layer 4 is removed by wet etching, and then polysilicon layer 4 serving as a capacitor electrode is patterned. When insulating film 5 is removed by the wet etching, however, the surface portions of insulating film 5 between polysilicon layers 4 and 6 are over-etched, as shown by broken lines A and B in FIG. 2C.

As illustrated in FIG. 2C, therefore, not only the surfaces of polysilicon layers 4 and 6 but also the sides thereof are exposed. If polysilicon layers 4 and 6 are thermally oxidized to form an interlayer insulating film in this state, a stress is laterally applied to polysilicon layers 4 and 6, and a strong stress is caused in the regions represented by broken lines A and B in FIG. 2C. The stress degrades the withstanding voltage of insulating film 3 and reduces the reliability of the trench capacitor. As a result, defective crystals (shown by x) are easy to occur in the vicinity of the groove in substrate 1 by the stress applied to polysilicon layers 4 and 6. These defective crystals cause a leak or the like to be generated.

Furthermore, the conventional method of manufacturing the semiconductor device requires a manufacturing step of forming insulating film 5 as a stopper when polysilicon layer 6 is removed by etching, and a manufacturing step of removing insulating film 5 for patterning of polysilicon layer 4. The manufacturing steps are thus complicated.

SUMMARY OF THE INVENTION

It is accordingly an object of the present invention to provide a method of manufacturing a semiconductor device capable of preventing the degradation of a withstanding voltage of a trench capacitor and generation of defective crystals and simplifying the manufacturing steps.

According to the present invention, there is provided a method of manufacturing a semiconductor device comprising the steps of selectively etching a semiconductor substrate to form a groove therein, forming a first layer of a conductivity type on the sides and the bottom of the groove, forming a second layer of an insulation type on the first layer and the semiconductor substrate, forming a third layer of a conductivity type on the second layer, patterning the third layer to form a capacitor electrode, forming a fourth layer of an insulation type which covers the capacitor electrode, forming a fifth layer on the fourth layer so as to fill up the groove, etching the fifth layer so as to remain only in the groove, and forming a sixth layer of an insulation type on the fifth layer.

According to the manufacturing method of the present invention, since the third layer is patterned to form the capacitor electrode and then the fourth layer is formed, the fourth layer need not be removed for the patterning of the third layer. For this reason, unlike the conventional device, the sides of the fifth layer embedded in the groove are not exposed and only the surface thereof is exposed. Even though the fifth layer is thermally oxidized to form the sixth layer, the fifth layer is only oxidized from the top and accordingly no stress is applied to the fifth layer, thereby suppressing the degradation of the withstanding voltage of the trench capacitor and the generation of defective crystals. Since the fourth layer functions as both a stopper of the etching performed to leave the fifth layer only in the groove and an interlayer insulating film, it is unnecessary to form an insulating film exclusively for the stopper of the etching and it is possible to simplify the manufacturing steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 3A to 3H are cross-sectional views showing steps of manufacturing a semiconductor device including a trench capacitor according to an embodiment of the present invention.

DETAILED DESCRIPTION OF THE PREFERRED EMBODIMENT

A method of manufacturing a semiconductor device having a memory cell of a one-transistor and one-capacitor type according to an embodiment of the present invention will be described with reference to accompanying FIGS. 3A to 3H.

Figure 1:
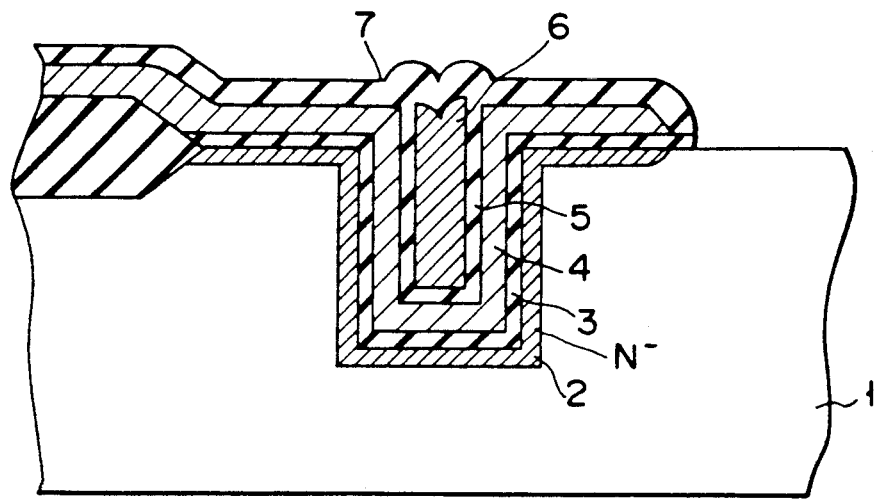
FIG. 1 is a cross-sectional view showing a structure of a conventional trench capacitor.
Figure 2A:
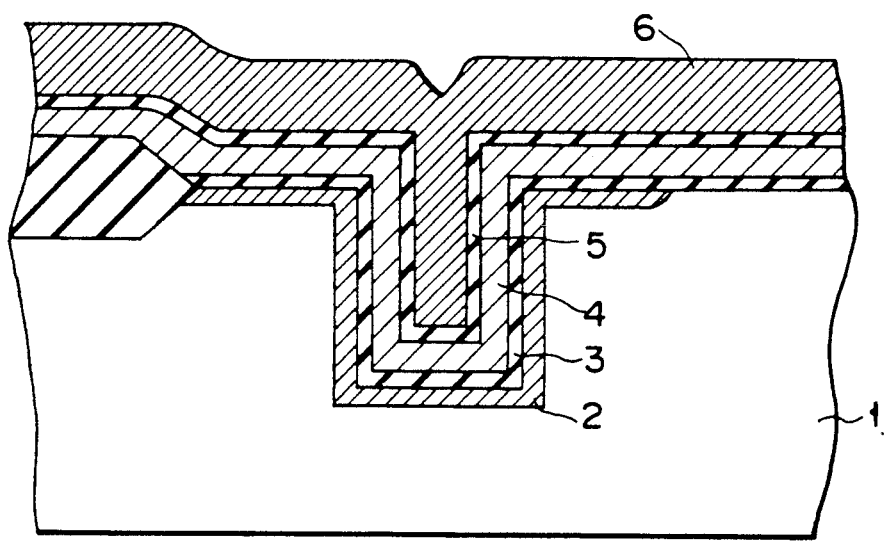
FIGS. 2A to 2C are cross-sectional views showing conventional steps of manufacturing the trench capacitor shown in FIG. 1.
Figure 2B:
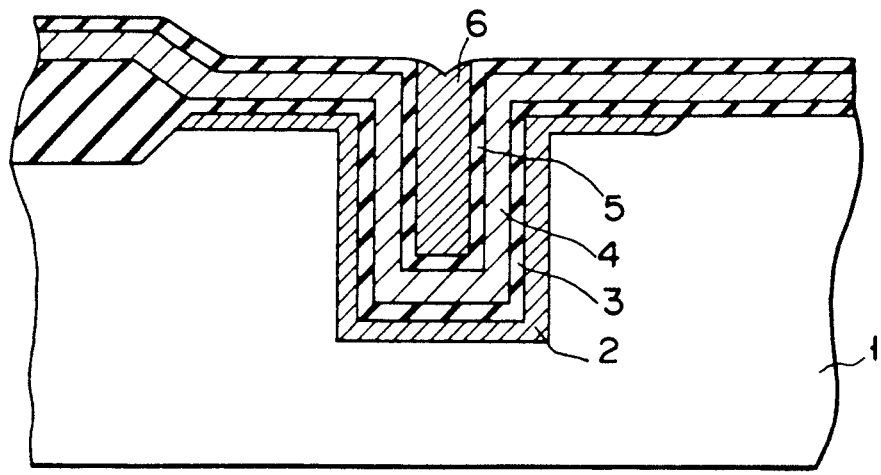
Figure 2C:
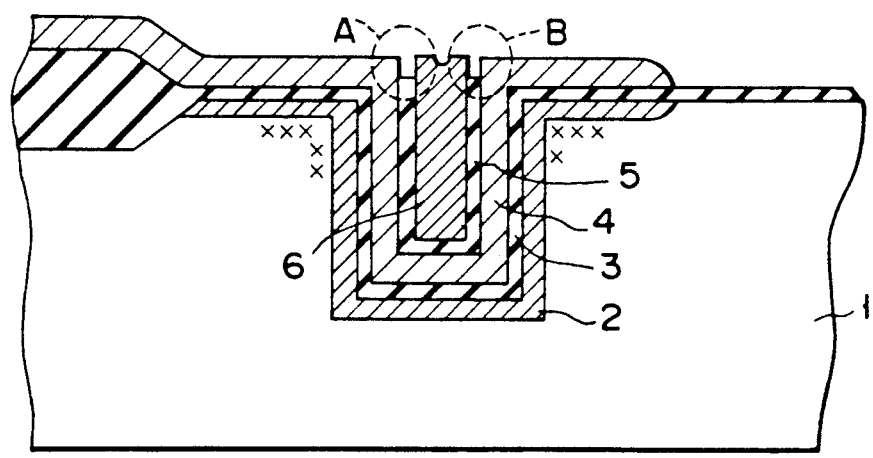
Figure 3A:
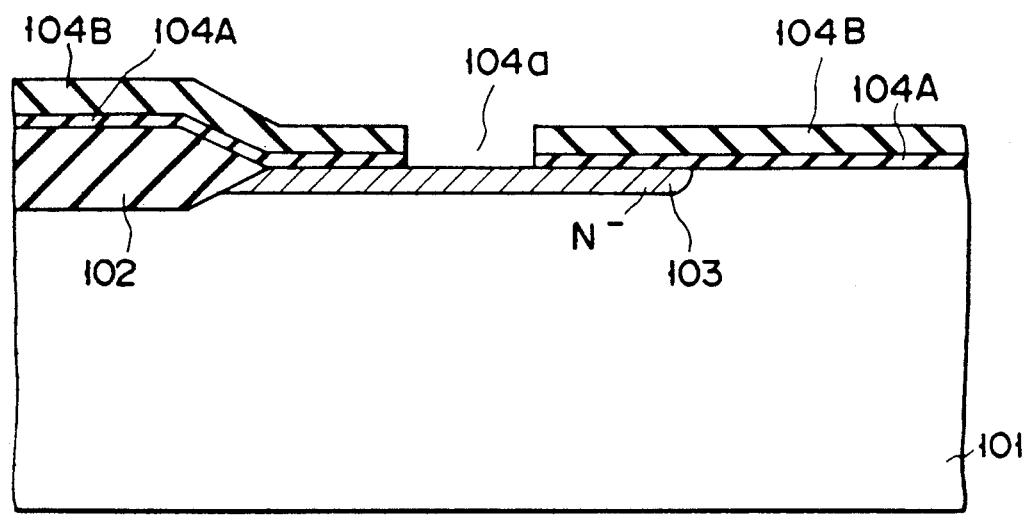
Figure 3B:
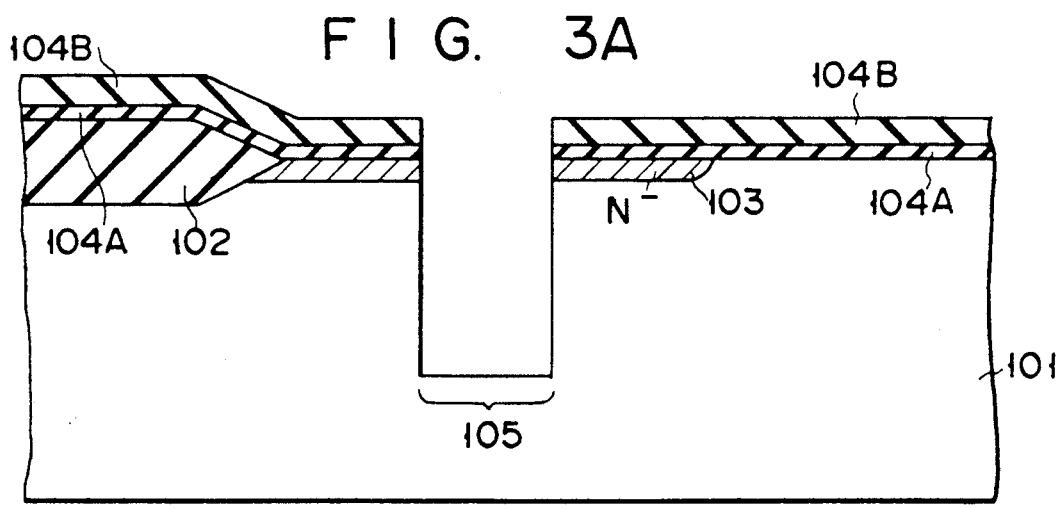

As shown in FIG. 3A, field oxide film 102 for element isolation is formed on the surface of P-type silicon substrate 101 by the LOCOS method. Arsenic is by the photolithography technique and ion implantation technique to form $N^-$-type diffusion layer 103 having a thickness of 0.2 to 0.25 gm and an impurity concentration of about $1 \times 10^{19}/cm^3$. $Si_3N_4$ film 104A of 500 to 100 Å in thickness is deposited on substrate 101 by the LP-CVD method and then $SiO_2$ film 104B of the 5000 to 6000 Å is deposited on $Si_3N_4$ film 104A by the CVD method. Opening 104a is formed in predetermined regions of $Si_3N_4$ film 104A and CVD-$SiO_2$ film 104B. Using CVD-$SiO_2$ film 104B as a mask, substrate 101 is etched by, e.g., the RIE (reactive ion etching) technique to form groove 105 having a depth of about 3 μm, as shown in FIG. 3B.

Figure 3C:
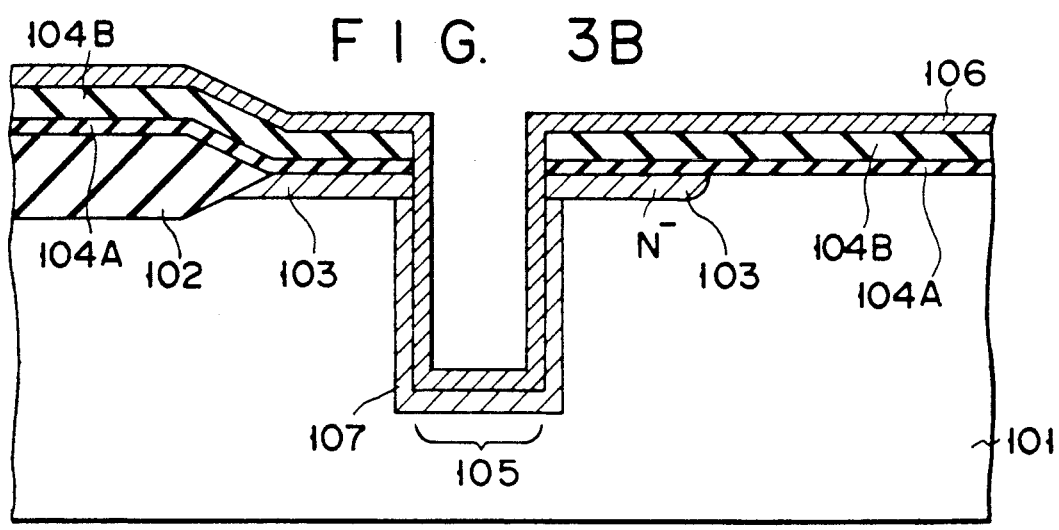

As illustrated in FIG. 3C, for example, PSG film 106 of about 1000 Å is deposited, as a diffusion source of N-type impurities, all over the surface of the device including the inner surface of the groove 105. PSG film 106 is thermally treated and thus N-type impurities are diffused into substrate 101, thereby forming N-type diffusion layer 107 along the bottom and the sides of groove 105.

As illustrated in FIG. 3D. PSG film 106 and CVD-$SiO_2$ film 104B are removed by wet etching using, e.g., hydrofluoric acid, and then $Si_3N_4$ film 104A is removed by wet etching using, e.g., hot phosphoric acid. As shown in FIG. 3E, thermal oxidation is performed to form oxide film 108 having a thickness of 100 to 200 Å on the inner surface of groove 105 and on that of substrate 101.

As illustrated in FIG. 3F, polysilicon film 109 of 2000 to 4000 Å in thickness is deposited on oxide film 108 by the LP-CVD method and it is doped with N-type impurities such as phosphorus, and then polysilicon film 109 is patterned to form a capacitor electrode. After that, polysilicon film 109 is thermally oxidized to form interlayer insulating film 110 of 100 to 200 Å in thickness, which is constituted of $SiO_2$, so as to cover polysilicon film 109. Polysilicon film 111 is then deposited all over the surface of interlayer insulating film 110 so as to fill up groove 105 by the LP-CVD method.

Figure 3G:
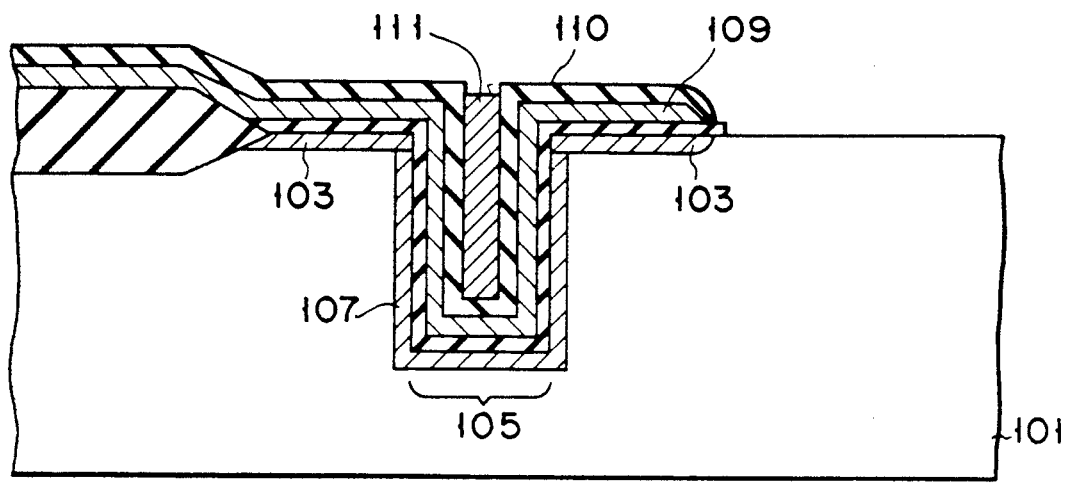

Subsequently, as shown in FIG. 3G, polysilicon layer 111 is removed by etching so that it remains only in groove 105. Oxide film 108 formed on substrate 101 is removed by the wet etching to expose the surface of substrate 101.

Figure 3H:
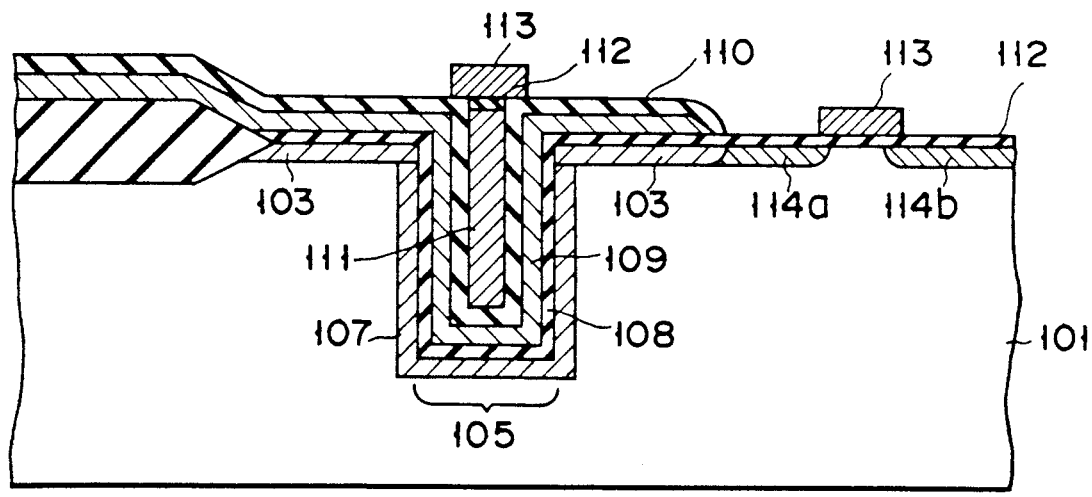

FIG. 3H shows the following processing. Gate oxide film 112 having a thickness of about 200 Å is formed on the exposed surface of the substrate 101, and on the surface of polysilicon layer 111 which remains in groove 105. Polysilicon film 113 is deposited on oxide film 112 and it is doped with impurities. Then, polysilicon film 113 is selectively etched to form a gate electrode, and N-type diffusion layers 114a and 114b serving as a source and a drain regions, are formed by a common ion implantation technique.

As has been described in detail, according to the embodiment of the present invention, after polysilicon film 109 serving as a capacitor electrode is patterned, interlayer insulating film 110 is formed on polysilicon film 109, and then polysilicon film 111 for filling up groove 105 is formed on interlayer insulating film 110. Unlike the conventional device, therefore, the sides of polysilicon film 111 are not exposed and only the surface thereof is exposed. Since polysilicon film 111 is only oxidized from the top, it is possible to prevent a strong stress from being applied to polysilicon film 111, and to prevent the degradation of a withstanding voltage of the trench capacitor and the generation of defective crystals.

Since interlayer insulating film 110 serves as a stopper of the etching for leaving polysilicon film 111 in groove 105, it is unnecessary to form and remove a film exclusively for a stopper. The manufacturing steps can be simpler than the conventional manufacturing steps.

A pad oxide film can be formed in the lower portion of $Si_3N_4$ film 104A. In place of PSG film 106 serving as a diffusion source of N-type diffusion layer 107, another kind of silicate glass film containing at least N-type impurities such as an AsSG film. Further, as a film embedded in the groove 105, an insulating film such as $Si_3N_4$ film can be used in place of polysilicon film 111. In place of oxide film 108 serving as a dielectric film of the capacitor, a dielectric film such as a $Si_3N_4$ film and a $Ta_2O_5$ film or a compound film of a plurality of dielectric films such as a three-layered structure of $SiO_2$ film, $Si_3N_4$ and $SiO_2$ film, can be used. Since an insulating film using the $Si_3N_4$ film or a $Ta_2O_5$ film allows a high dielectric constant, a larger capacitance can be achieved.

The semiconductor device having a trench capacitor according to the embodiment described above can prevent the degradation of a withstanding voltage of the trench capacitor and the generation of defective crystals, and can simplify the manufacturing steps.

Additional advantages and modifications will readily occur to those skilled in the art. Therefore, the invention in its broader aspects is not limited to the specific details, and illustrated example shown and described. Accordingly, departures may be made from such details without departing from the spirit or scope of the general inventive concept as defined by the appended claims and their equivalents.

What is claimed is:

1. A method of manufacturing a semiconductor device including a trench capacitor, the method comprising the steps of:

selectively etching a semiconductor substrate to form a groove therein;

forming a conductive first layer on the sides and bottom of said groove and on said semiconductor substrate, said conductive first layer serving as a first plate electrode of said capacitor;

forming an insulating second layer on said first layer and on said semiconductor substrate, said insulating second layer serving as a dielectric of said capacitor;

forming a conductive third layer on said insulating second layer;

patterning said third layer so as to remain at a position corresponding to that of said first plate electrode, in order to form a second plate electrode of said capacitor;

forming an insulating fourth layer which covers said second plate electrode;

forming a fifth layer on said fourth layer so as to fill said groove;

etching said fifth layer so that it remains only in said groove; and forming an insulating sixth layer on said fifth layer.

2. The method according to claim 1, wherein the step of forming a conductive first layer comprises forming an impurity diffusion layer on the sides and bottom of said groove.

3. The method according to claim 2, wherein the step of forming an impurity diffusion layer comprises forming a silicate glass layer containing impurities on the sides and the bottom of said groove and diffusing the impurities of said silicate glass layer into said semiconductor substrate along the sides and bottom of said groove.

4. The method according to claim 1, wherein said second layer comprises a compound film of a plurality of dielectric films.

5. The method according to claim 1, wherein said fifth layer includes a polysilicon film.

6. The method according to claim 1, wherein said fifth layer includes an insulation film.

7. A method of manufacturing a semiconductor device having a memory cell comprising a trench capacitor and a MOS transistor, the method comprising the steps of:

forming a first diffusion layer in a semiconductor substrate;

selectively etching a semiconductor substrate to form a groove in a region of said substrate in which a capacitor is to be formed;

forming a silicate glass layer containing impurities on the sides and bottom of;

diffusing the impurities of the silicate glass layer into said semiconductor substrate along the sides and bottom of said groove, so as to form a first plate electrode of said capacitor;

forming a dielectric layer, which serves as a dielectric of said capacitor, on said first plate electrode and said semiconductor substrate;

forming a conductive layer including a polysilicon film, on said dielectric layer;

patterning said conductive layer so as to remain in a region of said semiconductor substrate in which said capacitor is to be formed and so as not to extend over a region in which said MOS transistor is to be formed, in order to from a second plate electrode of said capacitor;

forming an interlayer insulating film covering said second plate electrode;

forming an embedded layer on said interlayer insulating film so as to fill said groove;

etching said embedded layer so as to remain only in said groove; and forming an insulating film on said embedded layer.

8. The method according to claim 7, wherein said embedded layer includes a polysilicon layer.

9. The method according to claim 8, wherein said insulation film is formed by oxidizing said embedded layer.

* * * * *

UNITED STATES PATENT AND TRADEMARK OFFICE
CERTIFICATE OF CORRECTION

PATENT NO. : 5,066,609

DATED : November 19, 1991

INVENTOR(S) : Yamamoto et al.

It is certified that error appears in the above-identified patent and that said Letters Patent is hereby corrected as shown below:

Title page, item [30], Foreign Application Priority Data: delete in its entirety.

Signed and Sealed this

Fourteenth Day of September, 1993

Attest:

BRUCE LEHMAN

Attesting Officer

Commissioner of Patents and Trademarks